United States Patent [19]

Brower et al.

[11] 4,422,885

[45] Dec. 27, 1983

[54] POLYSILICON-DOPED-FIRST CMOS PROCESS

[75] Inventors: Ronald W. Brower, Kettering; Samuel Y. Chiao, West Carrollton; Robert F. Pfeifer, Centerville; Roberto Romano-Moran, Centerville, all of Ohio

[73] Assignee: NCR Corporation, Dayton, Ohio

[21] Appl. No.: 332,037

[22] Filed: Dec. 18, 1981

[51] Int. Cl.[3] .................. H01L 21/22; H01L 29/78; H01L 11/14

[52] U.S. Cl. .................................. 148/1.5; 29/571; 29/576 B; 29/578; 148/187; 357/42; 91

[58] Field of Search ............... 148/1.5, 187; 29/571, 29/576 B, 578; 357/42, 91

[56] References Cited

U.S. PATENT DOCUMENTS

| | | | |
|---|---|---|---|
| 4,224,733 | 9/1980 | Spadea | 148/1.5 |
| 4,277,291 | 7/1981 | Cerofolini et al. | 148/1.5 |
| 4,280,272 | 7/1981 | Egawa et al. | 29/571 |
| 4,295,897 | 10/1981 | Tubbs et al. | 148/1.5 |
| 4,306,916 | 12/1981 | Wollesen et al. | 148/1.5 |
| 4,314,857 | 2/1982 | Aitken | 148/1.5 |
| 4,345,366 | 8/1982 | Brower | 29/576 B |

Primary Examiner—Upendra Roy
Attorney, Agent, or Firm—J. T. Cavender; Casimer K. Salys; T. Rao Coca

[57] ABSTRACT

Disclosed is a process for forming self-aligned polysilicon gates and interconnecting conductors having a single conductivity and single impurity type in CMOS integrated circuits. After forming a polysilicon layer over the gate oxide, the polysilicon is doped with n-type impurities. Next, the polysilicon is covered with a relatively thick oxide serving as an implantation mask and then patterned into gates and conductors. Finally, by using ion implantation sources and drains for the p-FET and n-FET are formed in a self-aligned relationship with the corresponding gates.

1 Claim, 11 Drawing Figures

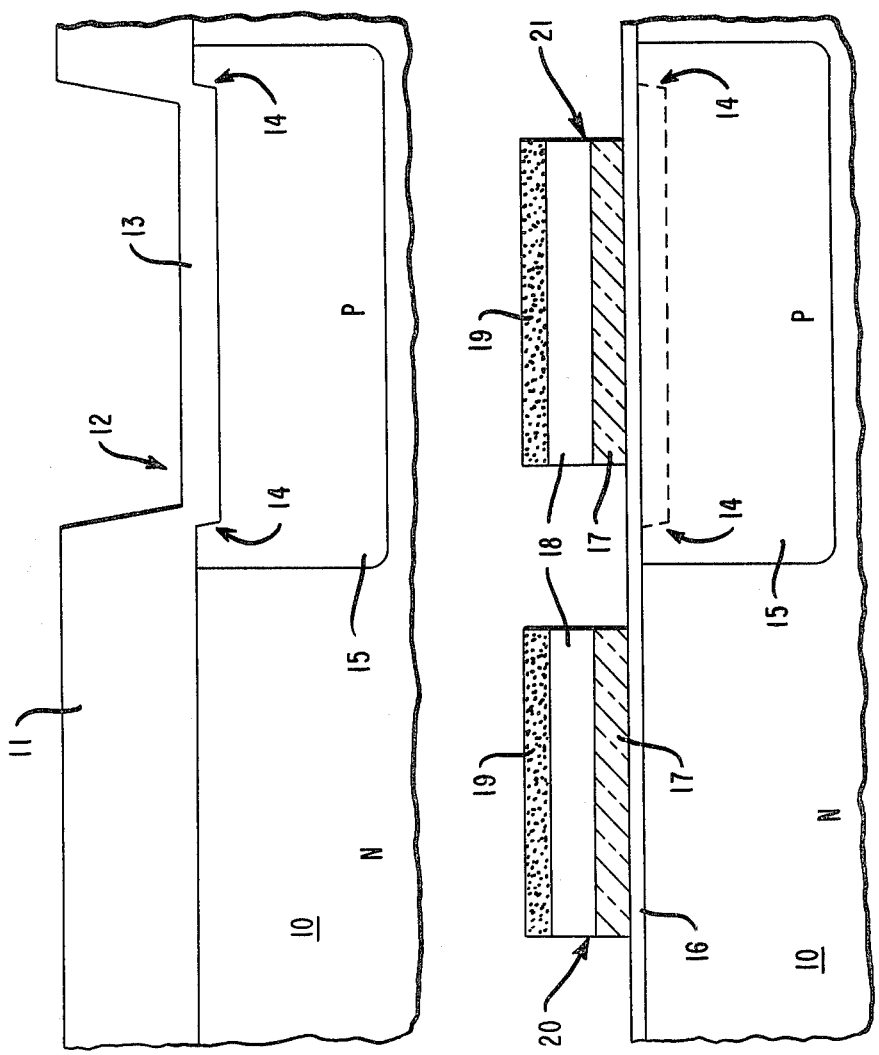

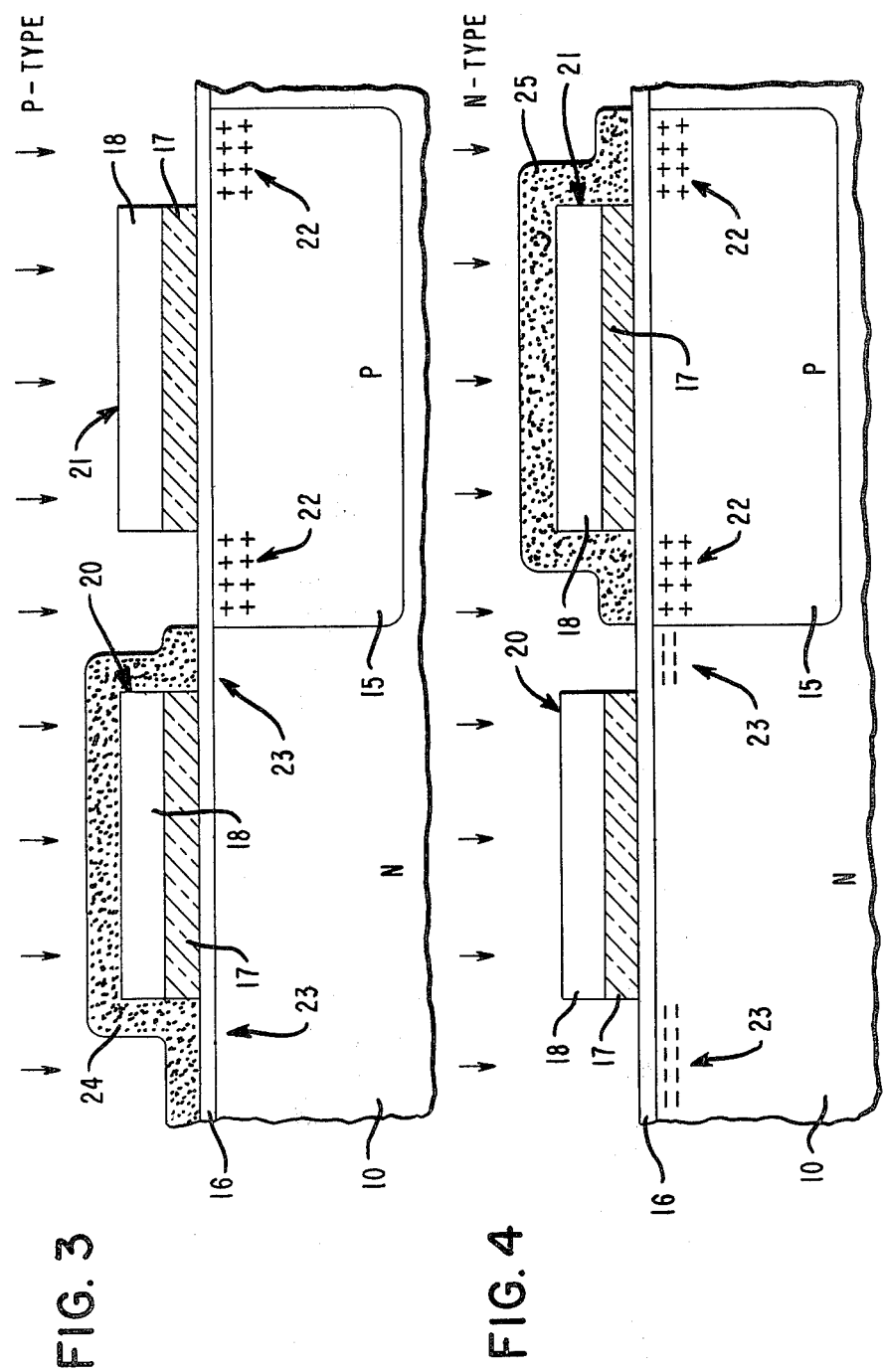

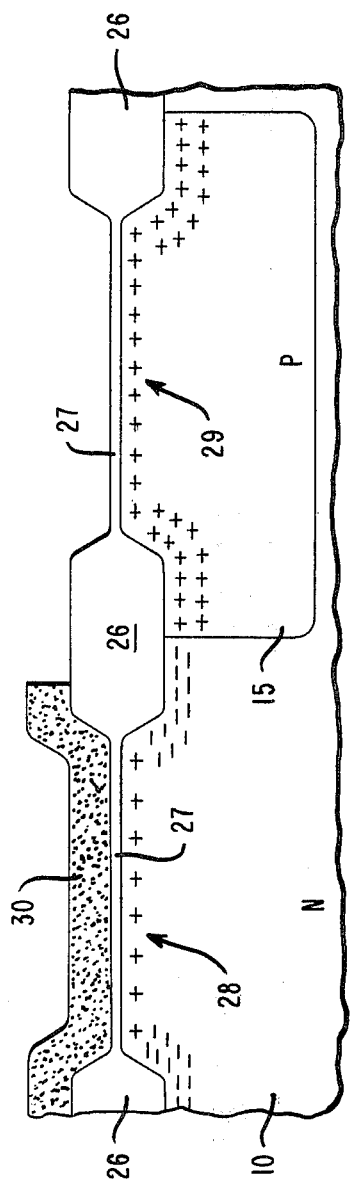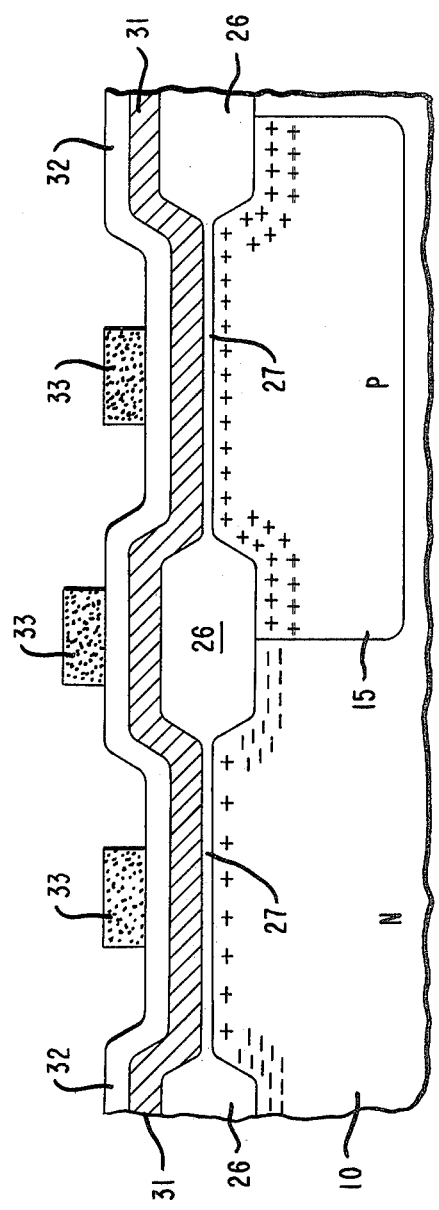
FIG.7
FIG.8

POLYSILICON-DOPED-FIRST CMOS PROCESS

BACKGROUND OF THE INVENTION

1. Field of the Invention

This invention relates to complementary metal oxide semiconductor (CMOS) devices having polysilicon gate electrodes and interconnecting conductors of a single conductivity and single impurity type and, more particularly, to a process for fabricating such a CMOS device.

2. Description of the Prior Art

A CMOS device consists of an n-FET and a p-FET which are coupled so that the source or drain of one device is connected to the source or drain of the other device. In operation, one of the transistors will be functioning and the other will be off. When operating conditions within the circuit dictate that the functioning transistor turn off, the transistor which was previously off will begin to function due to the interconnection of sources and/or drains of the two transistors. Thus, very little power is required during the non-switching state for these transistors, thereby enabling reduced power consumption. Other advantageous features of a CMOS device include high speed and performance. Balanced against these is the complexity of the processing technology of CMOS devices, particularly in meeting the stringent requirements of high integration (or packing) density and high performance in very large scale integrated circuit applications.

In an attempt to meet the above requirements, conventional metal gate CMOS processing techniques have been replaced by silicon gate technology since this provides an area savings due to the better tolerances arising from the self-aligned nature of such gate structures, due to the ability to provide an additional layer of interconnect and due to the availability of buried contacts.

In one example of prior art silicon gate CMOS processes, U.S. application Ser. No. 218,891 by R. F. Pfeifer and M. L. Trudel (hereafter, Pfeifer et al.) entitled "Method for Fabrication of Improved Complementary Metal Oxide Semiconductor Devices" and assigned to the assignee of the present invention, discloses forming the desired pattern of gate electrode and interconnecting conductors on a semiconductor substrate such that each of the gate electrodes and conductors overlies a thin layer of gate oxide and is covered by a suitable oxidation and diffusion mask. The oxidation and diffusion mask, which consists of a dual layer of silicon dioxide and silicon nitride, serves as an oxidation mask and an implant/diffusion mask for the gate electrodes. The source and drain regions of the p-FET's and n-FET's are alternatively masked and formed by diffusing or implanting p-type and n-type impurities into the substrate. A layer of barrier oxide is then thermally grown on the semiconductor substrate to completely cover the source and drain regions, thereby protecting these regions from further doping during subsequent doping of the gate electrodes and conductors. Thereafter, the oxidation and diffusion mask which overlies each of the gate electrodes and conductors is selectively removed (while leaving the source and drain regions covered), thereby exposing the underlying gate electrodes and conductors. The exposed gate electrodes and conductors are then doped using a conventional doping technique.

Using this process Pfeifer et al. provide a CMOS device having polysilicon gates of a single conductivity and n-type impurities.

Because all of the gate electrodes and conductors have the same type of impurities, Pfeifer et al. avoid the need for metal bridges between (n+ and p+) polysilicon conductors, which would otherwise be required, thereby making more efficient use of chip area. Also, because all the gate electrodes are not subjected to p-type dopant (e.g., boron) the problem of dopant (particularly, boron) penetration from the gate electrode, through the thin oxide layer which separates the gate electrode from the underlying semiconductor substrate, and into the underlying substrate thereby changing the threshold voltage of the p-FET or producing a short between their source and drain regions is eliminated.

In implementing the Pfeifer et al. process, the oxidation of source and drain regions may consume some of the dopant in these regions. This may result in a higher source-to-drain interconnect resistance, thereby decreasing the device speed. Also, the process requires precise determination of the etch time for removal of the oxidation and diffusion mask to prevent accidental removal of the oxide mask over the source and drain regions. As will be appreciated, it is desirable to have a process which provides the above-described advantages of Pfeiffer et al. and also eliminates these concerns with oxidation and etch time.

SUMMARY OF THE INVENTION

The present invention overcomes the above disadvantages of the prior art by first doping the polysilicon gates to the desired level of conductivity, thereby eliminating the requirement of oxidation of source and drain areas, and, second, using a single oxide mask over the polysilicon gate and not removing this mask, thereby eliminating altogether the requirement of etching the mask over the polysilicon.

Specifically, the present invention relates to a process for forming a CMOS device which is tailored to permit single conductivity-type and single impurity type gate doping for both p-FET's and n-FET's. In one embodiment, first a polysilicon layer is formed over the p-FET and n-FET regions and then doped n+. Thereafter, an oxide mask is formed over the n+ polysilicon to protect the polysilicon from further doping during the n-FET/p-FET source and drain forming steps. N+ polysilicon gates are then defined followed by forming self-aligned n-FET and p-FET source and drain regions by alternately masking and implanting n-type and p-type impurities into the substrate. Finally, without removing the oxide mask over the polysilicon gates an isolation oxide is formed over the entire structure. Contact vias are then simultaneously etched in the different thickness oxide over the gates and source and drain regions, followed by metallization.

DESCRIPTION OF THE DRAWINGS

FIGS. 1-11 are cross-sectional views illustrating various process steps of the present invention for forming a CMOS device with polysilicon gates of a single conductivity and single impurity type.

DETAILED DESCRIPTION OF THE INVENTION

Figure 5:
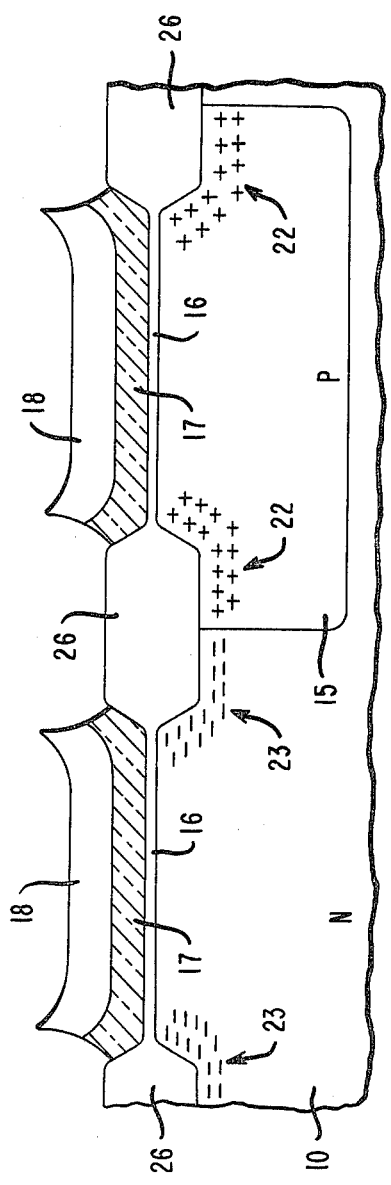

Reference is now made to FIGS. 1-11 wherein the successive steps of the fabrication process of the present invention are illustrated in detail. The steps to be discussed hereafter are illustrative of one technique for implementing the process of the subject invention. It will be obvious to those skilled in the micro-electronics art that the specific processes for implementing the various steps may be carried out in a number of different ways.

The drawings herein are not to scale. The scale has been changed where needed to clearly show the structure.

Referring now to FIG. 1, the process of the present invention is initiated by selecting a semiconductor substrate 10 as the starting material. In order to accommodate both p-FET's and n-FET's on one chip, it is necessary to locate either type transistor (or both) in an isolation well(s). In other words, n-FET's should be located in p-wells formed on an n-type substrate, or p-FET's located in n-wells formed on a p-type substrate, or each type of transistor located in its corresponding well formed on an n-type or p-type substrate. The choice presented here depends on such considerations as the particular application of the CMOS device, compatibility of this process with other processes on the manufacturing line, and device physics, e.g., latch-up phenomenon and transconductance of n-FET's and p-FET's. For illustrative purposes, the substrate 10 shown in FIG. 1 is n-type silicon upon which a p-well 15 is formed. To form the p-well 15, the surface of substrate 10 is first cleaned and then oxidized, for example, by placing in a high temperature (1,000° C.) steam oxidation furnace, forming a relatively thick (of the order of 6500 Angstroms) silicon oxide 11. Next, a p-well opening 12 is etched in the oxide 11 using conventional photolithography and buffered hydrofluoric acid etching. Then, a relatively thin (e.g., 900 Angstroms) layer of silicon oxide 13 is thermally grown in the opening 12. During this oxide 13 growing step, little or no oxidation takes place in the remainder of the substrate since the oxidation thereover is diffusion limited by the thick oxide 11. Also, during this process step the silicon substrate in the opening 12 is consumed to a depth equal to approximately one-half of the oxide 13 thickness (i.e., 450 Angstroms, in the above example) due to the well-accepted fact that the thickness of the oxide grown from silicon is approximately twice that of the silicon consumed. As a consequence of this latest oxidation, a topographical step 14—14 (of an approximate 450 Angstroms height) is formed in the substrate, as shown in FIG. 1. This topographical step will be useful for aligning purposes at a later stage of the present process, as explained hereinbelow.

Referring further to FIG. 1, the p-well 15 is then formed by implanting p-type ions (such as boron) into the substrate 10 through the opening 12. During this implantation, the energy of the ions is so chosen as to penetrate the thin oxide layer 13, but not the thick oxide layer 11, thereby doping only the p-well 15. For the oxide thickness specified above, typically, boron ions of energy 60 keV and dose $4 \times 10^{12}$ ions per square centimeter is used. To achieve the proper depth for the p-well, the structure is then subjected to a long, high temperature diffusion cycle. An exemplary procedure is to introduce the structure in a furnace having a gaseous nitrogen atmosphere at a temperature of 1200° C. for about 24 hours. After the completion of this step, the boron ions diffuse laterally and downward to a distance of about 6 microns.

After forming the p-well 15, the oxide layers 11 and 13 are removed by using a conventional etching technique.

Referring to FIGS. 2 and 3, the next step of the process involves formation of channel stops which define the active region of the p-FET and n-FET to be formed subsequently. Referring to FIG. 2, as a first step in forming the channel stops, an oxide layer 16, hereinafter called support oxide, is grown from the substrate by dry thermal oxidation to isolate the substrate 10 from the next to be formed silicon nitride layer 17. The support oxide 16 prevents damage to the silicon substrate 10 caused by stresses which would be created on the substrate by a silicon nitride 17-silicon 10 interface. Such stresses induce dislocations in the silicon substrate 10 which result in undesirable leakage current channels and otherwise have a deleterious effect on the electrical characteristics of the interface. A typical thickness of the support oxide is about 550 Angstroms. Thereafter, and referring further to FIG. 2, a pair of oxidation and implantation masks are formed over the support oxide 16. First, nitride layer 17 is formed on the support oxide 16, then oxide layer 18 is formed on the nitride 17. The thicknesses of the nitride 17 and oxide 18 are typically in the range of (500–600) Angstroms and (1100–1300) Angstroms, respectively. The layers 17 and 18 are then patterned in a conventional manner using a photoresist 19 and then etched to form the dual-layer masks 20 and 21 which delineate the n-FET and p-FET active regions respectively. The topographical steps 14—14 in the p-well 15 discussed in connection with FIG. 1 are used to visually align the mask used to define the photoresist 19 over the dual mask 21. As shown in FIG. 3, the active regions are covered by the masks 20 and 21, whereas the field regions are covered only by support oxide 16.

Referring further to FIG. 3, the channel stops are then formed by doping the field regions which are potential sites of parasitic devices. In the completely formed CMOS device, metallized interconnect lines are formed over the field oxide. When an exceptionally high voltage is applied to a metallized line, the underlying substrate is prone to be inverted causing unwanted current flow between unrelated sources and drains. To suppress such parasitic FET's the field regions are doped, raising the threshold voltage of these regions to a level higher than the voltage that may be applied to the metallized lines. This field doping consists, in an exemplary process, of doping the p-well field regions 22—22 with p-type impurities and the n-substrate field regions 23—23 with n-type impurities. To dope the p-well field regions 22—22, first, a photoresist layer 24 is applied over the mask 20 and the n-substrate field regions 23—23 as shown in FIG. 3. Then, p-type ions, such as boron, are implanted in the p-well field regions 22—22 through the exposed support oxide 16. During this implantation step, the photoresist 24 protects the n-substrate field regions 23—23 and the p-FET active regions from doping and the mask 21 protects the n-FET active region from doping. The photoresist mask 24 is then removed.

Next, referring to FIG. 4, the n-substrate field regions 23—23 are doped by forming a photoresist layer 25 over the mask 21 and the p-well field regions 22—22 and implanting with n-type ions, such as phosphorus, in a manner analogous to the previous step. The photoresist mask 25 is then removed.

Referring to FIG. 5, next the field (isolation) oxide 26 of thickness in the range 6,000–10,000 Angstroms is grown, for example by wet oxidation at a temperature of about 1,000° C. During this high temperature oxidation the nitride layer 17 of masks 20 and 21 acts as a barrier to diffusion of oxygen species, thereby preventing growth of oxide in the n-FET and p-FET active regions.

Figure 6:
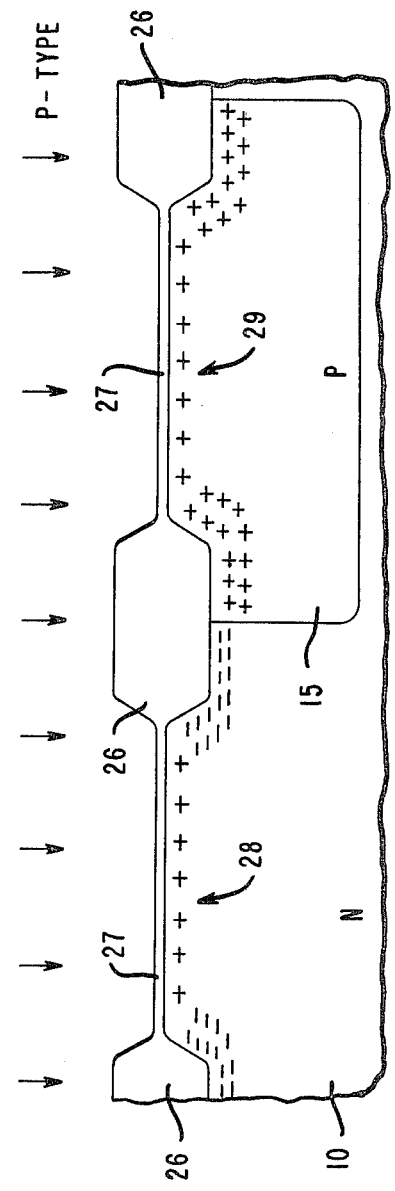

As shown in FIG. 6, the oxide mask 18, the nitride mask 17 and the support oxide 16 are then removed using conventional etching techniques. During this etching process, the thick field oxide regions 26 may be thinned somewhat, but not to a degree that their dielectric function is hampered. The bare active areas are now re-oxidized to form the gate oxide 27 of thickness in the range (300–1,000) Angstroms.

It is noted that the support oxide 16 (FIG. 5) may be left in place and used as the gate oxide. However, a preferred procedure is to remove the oxide 16 (FIG. 5) and form a new oxide 27 (FIG. 6) in its place since this procedure permits a better control of the gate oxide thickness and also eliminates any possible contamination of the gate oxide which might take place as in the case of support oxide 16 during the deposition and subsequent etching of nitride 17, etc.

After forming the gate oxide 27, the device active regions are subjected to one or two ion implantations (of the same or opposite impurity type) to adjust the threshold voltages of p-FET's and n-FET's to the desired value. If two implantations of opposite impurity type are used, two photoresist masks may have to be used to alternately mask and implant the p-FET and n-FET active areas. In the present exemplary process two ion implantations of the same conductivity type are accomplished. The type of implantation species, their energy, and dose is a function of several factors including the resistivity or doping level of the starting material, the doping level of the p-well 15, the gate oxide 27 thickness, the type of polysilicon gate (to be formed later) and the actual threshold voltages desired. For example, when the substrate 10 is n-type having a <100> crystal orientation and bulk resistivity of about (3–6) ohm-centimeter, the p-well 15 sheet resistance is about 7,000 ohms per square, the gate oxide 27 thickness is about 600 Angstroms, the polysilicon gates (to be formed) are n+-type, and the desired n-FET and p-FET threshold voltages are +1 volt and −1 volt, respectively, the two implantations can be accomplished using boron ions of different doses.

First, boron of dose $1.6 \times 10^{11}$ ions per square centimeter and energy 40 keV is implanted into the entire structure. During this step, referring to FIG. 6, the boron ions penetrate through the thin gate oxide 27 and are lodged in the p-FET and n-FET active regions forming the surface charge layers 28 and 29, respectively. As a result of this implantation step, the p-FET threshold voltage will be about −1 volt.

Next, referring to FIG. 7, the p-FET active region is protected using a photoresist mask 30 and the exposed n-FET active area is implanted using boron ions of a higher dose, $3.9 \times 10^{11}$ ions per square centimeter, and the same energy (of 40 keV) as before. As a result of this second implantation, the surface charge of layer 29 will be increased to a level that will result if a single implantation of dose $(1.6 \times 10^{11} + 3.9 \times 10^{11} =) 5.5 \times 10^{11}$ ions per square centimeter was used. At any rate, this combination of implantation steps sets the n-FET threshold voltage at about +1 volt, thereby matching it with the p-FET threshold voltage. The photoresist 30 is then removed.

Once the devices thresholds have been established at the desired level, the polysilicon gates and interconnecting lines can be formed. As shown in FIG. 8, a polysilicon layer 31 is formed on the semiconductor structure to a typical thickness of about 5000 Angstroms by, for example, chemical vapor deposition at atmospheric or low pressure of (0.3–1) millitorr. After forming, the polysilicon 31 is doped heavily using, for example, an n-type dopant. An exemplary process of doping the polysilicon 31 utilizes a phosphorus pre-deposition and furnace diffusion steps. During this step, the back surface of the substrate 10 is also doped for insuring good back surface ohmic contact which will be beneficial during the packaging stage of the CMOS device, and also acting as a getter for metallic impurities.

Figures 9, 10:
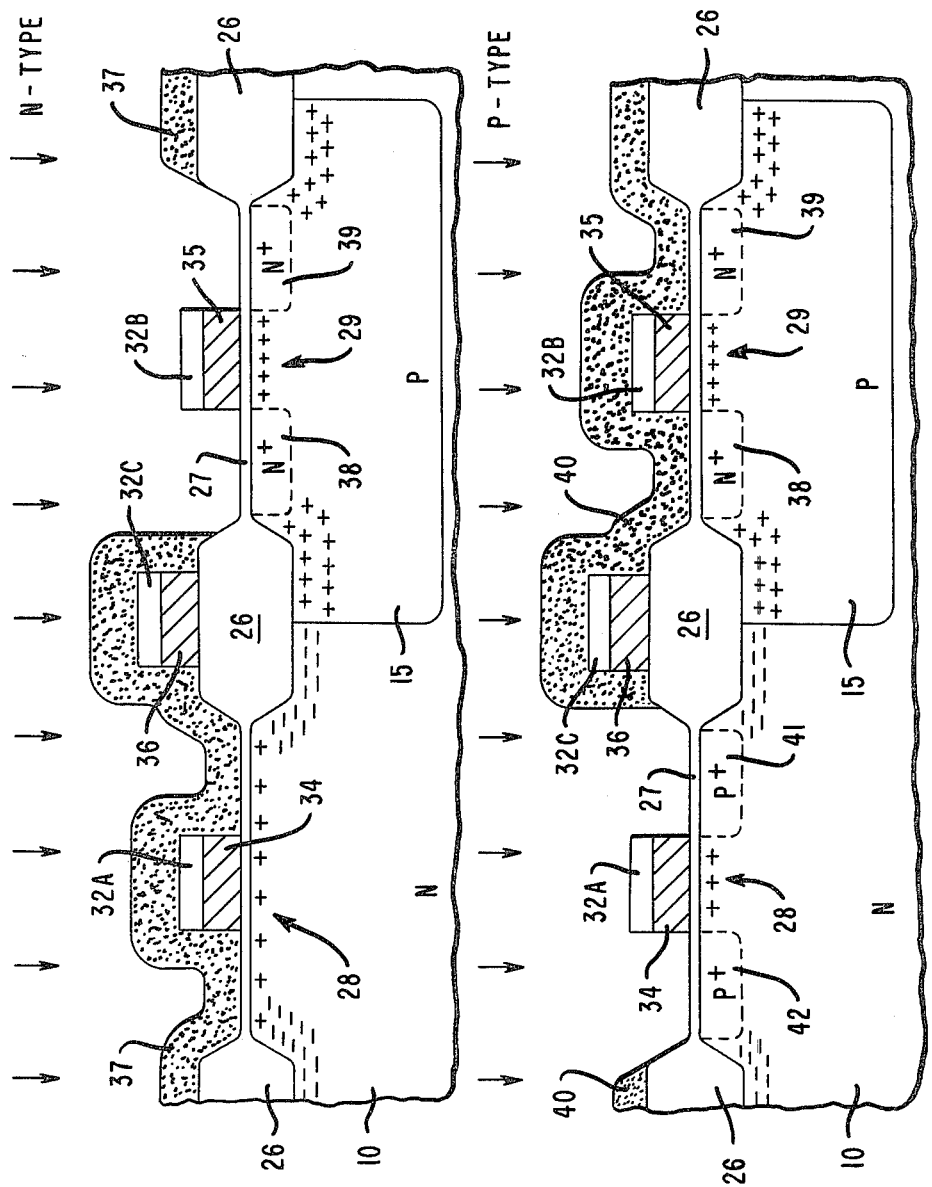

After the conductivity of the polysilicon 31 is increased to the desired level, a layer of silicon oxide 32 of about 3500 Angstroms thickness is formed by chemical vapor deposition on the polysilicon 31. The layer 32 protects the underlying silicon 31 from additional doping during the later p-FET and n-FET source and drain implantation steps. Then, using a photoresist mask 33, the polysilicon gates and interconnecting conductor lines are defined by sequentially etching the oxide layer 32 and polysilicon 31 using buffered hydrofluoric acid and a plasma, respectively. The photoresist 33 is then removed. Two polysilicon gates 34, 35 and one polysilicon conductor line 36 formed in the manner just described are shown in FIG. 9. Gate 34 is for the p-FET and gate 35 is for the n-FET. Conductor line 36 is formed on the top of the central field isolation oxide 26. Note that the oxide layer 32A, 32B, and 32C over the gates 34 and 35 and the interconnecting line 36, respectively, is not removed.

The next step of the process, shown in FIG. 9, is the formation of the source and drain for the n-FET. An exemplary technique for forming this step of the process involves depositing a layer of photoresist 37 on the semiconductor structure such that it uniformly covers the previously formed gate structures and conductor structures, then exposing and developing the photoresist to provide the photoresist mask 37 shown in FIG. 9. Specifically, mask 37 covers the p-FET active region, gate electrode 34 and conductor line 36. The thick field oxide regions 26, regardless of whether covered by mask 36 or not, of course, preserve intact the channel stops formed thereunder. There is no need to cover the n-FET gate electrode 35 by mask 37 because of the presence of the oxide mask 32B. As shown, only the active region of the n-FET is exposed. Thereafter, the source 38 and drain 39 of the n-FET are formed by implanting n-type impurities into the substrate. In performing this implantation step, n-FET gate 35 acts as a mask which serves to align the transistor's source 38 and drain 39 with the gate electrode 35. During this implantation step, the energy of the n-type ions are so chosen as to penetrate the thin oxide layer 27 over the source 39 and drain 40, but do not penetrate the relatively thick oxide 32B over the gate 35. Also, the n-type ion dose is chosen sufficiently high to counterdope the p-type surface layer 29 in the source 38 and drain 39 areas that was introduced previously, and produce n+ source 38 and drain 39. An exemplary set of implantation parameters for this step is arsenic ions of dose $8 \times 10^{15}$ ions per square centimeter and energy 80 keV. The sheet resistance of the n+ source 38 and drain 39 formed in this manner will be about 30 ohms per square. The photoresist 37 is then removed.

The source and drain regions of the p-FET are then formed in a manner analogous to the formation of n-FET source and drain. Referring to FIG. 10, using a conventional photolithographic techniques, a photoresist mask 40 is formed over the n-FET gate 35, source 38 and drain 39, and the conductor line 36. The p-FET gate electrode 34 is not covered by mask 40 since the oxide layer 32A masks this electrode. Thus, only the p-FET active region is exposed. P-type ions are then implanted to form the p+ source 41 and drain 42 in a self-aligned relationship with the gate 34, in a manner fully analogous to the previous step in connection with the formation of the n-FET source 38 and drain 39. An exemplary set of implantation parameters to form the source 41 and drain 42 is boron ions of dose $6 \times 10^{15}$ ions per square centimeter and energy 35 keV. The photoresist 40 is then removed.

After forming the n-FET and p-FET sources and drains, the semiconductor structure is subjected to a high temperature anneal step to repair any damage to the silicon substrate lattice that may have been caused by the source and drain implants and to insure that the implanted ions are electrically activated. Typically, annealing is done at about 1000° C. in a gaseous nitrogen atmosphere. It is noted that no specific annealing was necessary after the earlier implantation steps of this process, such as the implantations to form the channel stops and adjust the devices threshold voltages because during subsequent high temperature process steps, such as oxidation steps and polysilicon 31 deposition step, impurity activation naturally takes place.

Figure 11:
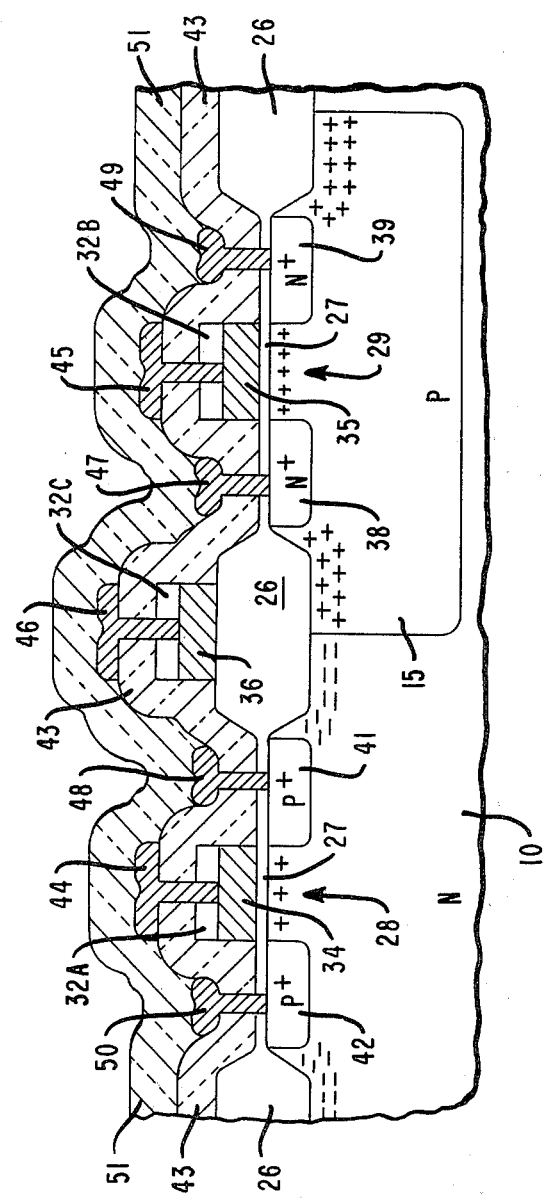

The remainder of the process is well-known. Referring to FIG. 11, which is a cross-sectional representation of a completed CMOS device in accordance with the process of this invention, the remaining steps of the process include: (1) formation of a thick (about 10,000 Angstroms) oxide 43 over the entire semiconductor structure to serve as an electrically insulating layer; (2) etching contact vias in oxide 43 corresponding to the sources 38 and 41, drains 39 and 42, gates 34 and 35 and interconnecting conductor 36; (3) depositing a conductive layer such as aluminum or aluminum-silicon alloy over the structure; (4) delineation of this conductive layer forming conductive contacts 44 and 45 for the polysilicon gates 34 and 35, respectively, conductive contact 46 for the interconnecting conductor 36, conductive contacts 47 and 48 for sources 38 and 41, respectively, contacts 49 and 50 for drains 39 and 42, respectively; and (5) forming a passivation layer 51 of a material such as phosphosilicate glass over the device.

While the invention has been particularly shown and described with respect to the preferred embodiment thereof, it will be understood by those skilled in the art that various changes in form and detail may be made therein without departing from the spirit and scope of this invention.

We claim:

1. A process for forming a CMOS device from a structure comprising a body of n-type semiconductor material having first and second active regions, respectively, with a p-well formed in the first active region, and a 300–700 Angstroms thin silicon dioxide layer formed over said body encompassing a gate region within each of said active regions, said process consisting of:

forming a polysilicon layer doped with n-type impurities over the thin silicon dioxide layer formed in said first and second active regions;

forming an oxide mask over the polysilicon defining gates and interconnecting conductors;

patterning the polysilicon in the presence of the oxide mask into gates corresponding to the gate regions and interconnecting conductors;

forming a first photoresist mask over the second active region;

implanting n-type impurities in source and drain regions defined in the first active region by the oxide mask;

removing said first photoresist mask;

forming a second photoresist mask over the first active region;

implanting p-type impurities in source and drain regions defined in the second active region by the oxide mask;

whereby said device has all n-type gates and interconnecting conductors of a single conductivity and is free of dopant penetration from said gates into said substrate via said thin silicon dioxide layer.

* * * * *